United States Patent [19]
Leitch

[11] Patent Number: 5,239,275
[45] Date of Patent: Aug. 24, 1993

[54] AMPLITUDE MODULATOR CIRCUIT HAVING MULTIPLE POWER SUPPLIES

[75] Inventor: Clifford D. Leitch, Coral Springs, Fla.

[73] Assignee: Motorola, Inc., Schaumburg, Ill.

[21] Appl. No.: 981,905

[22] Filed: Nov. 23, 1992

Related U.S. Application Data

[63] Continuation of Ser. No. 645,991, Jan. 25, 1991, abandoned, which is a continuation-in-part of Ser. No. 565,868, Aug. 9, 1990, abandoned, which is a continuation of Ser. No. 389,461, Aug. 4, 1989, abandoned.

[51] Int. Cl.[5] ............................................. H03C 1/40
[52] U.S. Cl. .................................. 332/152; 330/285; 332/178; 455/108; 455/127
[58] Field of Search .................... 332/149, 178, 152; 330/10, 285, 123; 455/108, 109, 126, 127

[56] References Cited

U.S. PATENT DOCUMENTS

| | | | |
|---|---|---|---|
| 3,413,570 | 11/1968 | Bruene et al. | 455/127 |
| 3,486,128 | 12/1969 | Lohrmann | 330/285 |
| 4,205,241 | 5/1980 | Fisher et al. | 307/361 |
| 4,403,197 | 9/1983 | Swanson | 330/10 |
| 4,442,407 | 4/1984 | Apel | 330/128 |
| 4,449,103 | 5/1984 | Kyrian | 330/123 |
| 4,580,111 | 4/1986 | Swanson | 332/152 |
| 4,611,162 | 9/1986 | Erratico et al. | 323/269 |
| 4,709,404 | 11/1987 | Tamura et al. | 455/126 |
| 4,731,869 | 3/1988 | Farrer | 455/127 |

*Primary Examiner*—Siegfried H. Grimm
*Attorney, Agent, or Firm*—M. Mansour Ghomeshi; Michael J. Buchenhorner

[57] ABSTRACT

An amplitude modulator circuit, having an input for receiving an input information signal and an output for providing an output signal, which is proportional to the input signal. The amplitude modulator circuit comprises at least two pass devices for amplifying the input information signal to produce the output signal and applying it to a load. The amplitude modulator circuit further comprises at least two voltage supplies for applying a plurality of supply voltages (at least some of which have different voltages) to the pass devices. The amplitude modulator circuit also includes a driver circuit having an input for receiving the input signal, and at least two driver outputs for driving the pass devices. The driver circuit activates the pass device having the lowest supply voltage that is sufficient to supply the required voltage to the load.

11 Claims, 3 Drawing Sheets

AMPLITUDE MODULATOR CIRCUIT HAVING MULTIPLE POWER SUPPLIES

This is a continuation of application Ser. No. 07/645,991, filed Jan. 25, 1991 and now abandoned, which was a continuation-in-part of application Ser. No. 07/565,868 filed Aug. 9, 1990 and now abandoned, and which was a continuation of application Ser. No. 07/389,461 filed Aug. 4, 1989 and now abandoned.

TECHNICAL FIELD

This invention relates generally to high efficiency amplitude modulation (AM) circuits. More specifically the invention relates to digital transmitters having linear radio-frequency amplifiers.

BACKGROUND

Prior AM transmitters have typically employed linear radio-frequency (RF) amplifiers. However, linear RF amplifiers usually have lower efficiency (i.e., the RF output power divided by the DC input power) than that of the non-linear saturating-type RF amplifiers used in frequency-modulation (FM) transmitters. Low amplifier efficiency creates a serious detriment in portable radios, because of their limited battery capacity.

Prior amplitude modulators have used several techniques for increasing efficiency, such as the Doherty amplifier, the outphasing amplifier, and "envelope elimination and restoration" (EER). Other prior amplitude modulators have used several techniques for increasing efficiency. First, some class A modulators employ a series pass regulator to drop the DC supply voltage for the last RF stage. This circuit is simple but it has a low efficiency since most of the input DC power is dissipated in the series pass transistor.

Second, class B modulators, commonly used in AM broadcast transmitters, modulate the DC supply voltage through a modulation transformer. Generally, this practice is applicable only to full carrier voice operation, and has moderate efficiency.

Third, the switching modulator is essentially a switchingtype series pass regulator. High efficiency is possible with this type of modulator but extensive filtering is required to remove switching frequency components from the output. Such output filtering causes a poor transient response making this type of modulator unsuitable for many digital transmission applications.

SUMMARY OF THE INVENTION

Accordingly, it is an object of the present invention to provide an amplitude modulator that accomplishes high efficiency operation by having minimum power loss.

Briefly, according to the invention, an amplitude modulator, comprises a plurality of amplifier means for receiving an input information signal and amplifying it to provide an output signal. The amplifier means have a selected gain. The amplitude modulator also comprises means for applying a plurality of voltage supplies (at least some of which have different voltages) to the amplifier means. The amplitude modulator also includes driver means having an input, coupled to receive the input signal, and a plurality of driver outputs. Each driver output is coupled to one of the amplifier means to provide the control signal that activates the amplifier means that is coupled to the voltage supply having the lowest voltage that is suffient to provide the selected gain. Thus, the efficiency of the amplitude modulator is enhanced because the voltage drop across the selected amplifier means is minimized.

DETAILED DESCRIPTION OF THE PREFERRED EMBODIMENT

Figure 1:
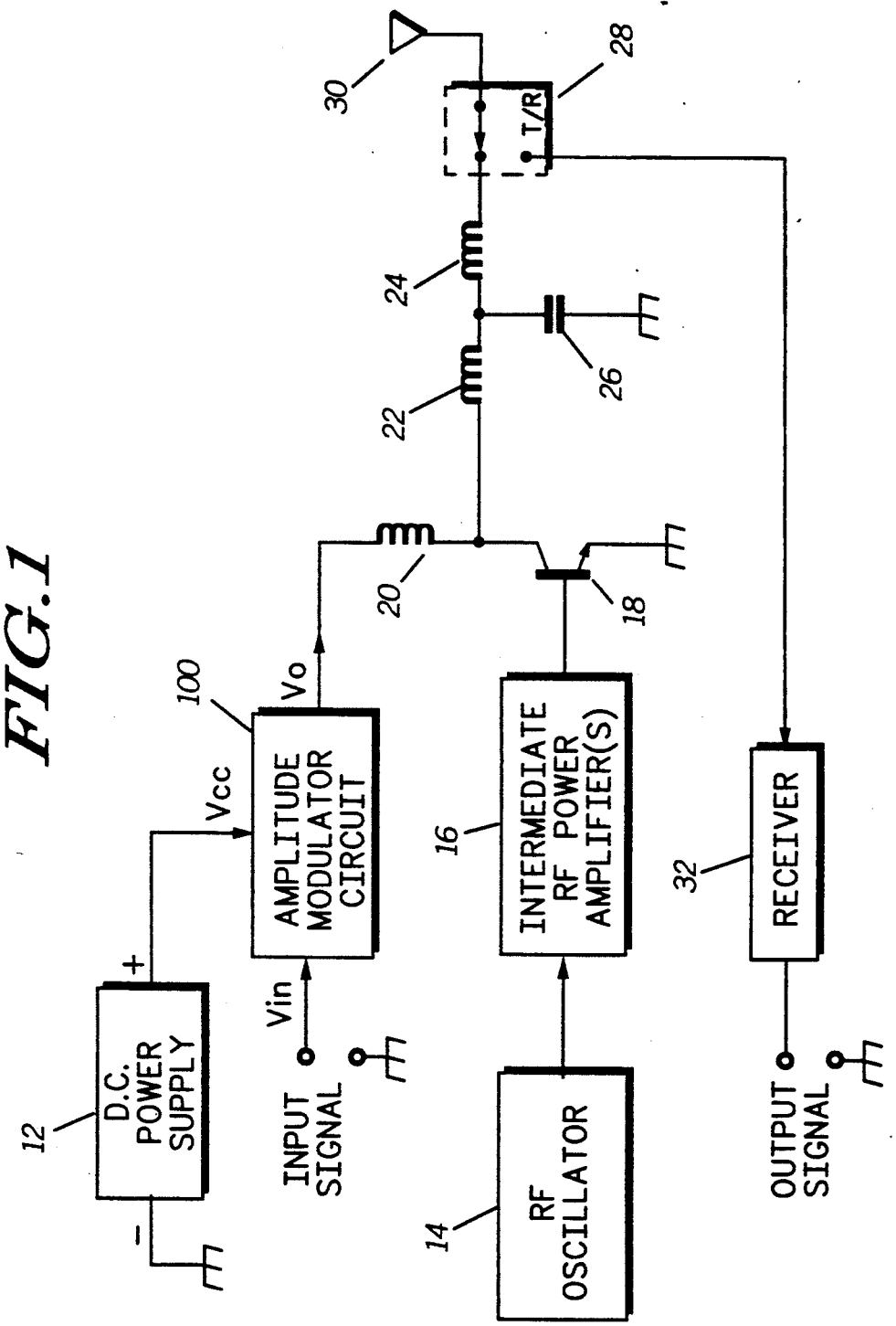
FIG. 1 is a schematic of a two-way radio having an amplitude modulation circuit in accordance with the invention.

Referring to FIG. 1, a radio transceiver 10 in accordance with the invention is shown. The transceiver 10 comprises a D.C. power supply 12 coupled to an amplitude modulator circuit 100 for providing a supply voltage Vcc thereto. The amplitude modulator circuit 100 (shown in detail in FIGS. 2 and 3) receives an input signal containing information to be modulated onto a radio-frequency carrier wave. This signal may be a voice signal (as from a microphone), a digital signal, or some other arbitrary signal. The amplitude modulator circuit 100 produces an output signal proportional to the input signal. The output signal is applied to an amplitude modulated RF amplifier 18, through an RF choke 20. In this embodiment, the RF amplifier 18 comprises a pnp transistor 18. However, other equivalent means for amplification may be used.

An RF oscillator 14 and an intermediate RF power amplifier provide a carrier waveform to the base of the transistor 18. The amplitude modulator circuit 100 amplifies the low-power input signal to a high power level suitable for modulating the modulated RF amplifier 18. In this embodiment by varying the collector supply voltage, Vo, of the modulated amplifier 18, in response to the input signal Vin, the amplitude of the modulated amplifier 18 is caused to vary in response to the input signal, Vin, thereby accomplishing the amplitude modulation of the RF carrier.

The RF choke 20, and an output tuning network, comprising series inductors 22 and 24 and a capacitor 26 coupled to ground, couple the modulated RF signal to an antenna 30 for transmission (when the switch 28 is in the "transmit" position). The radio transceiver 10 may also include a conventional receiver section 32 for providing an output (e.g., audio) signal.

Figure 2:
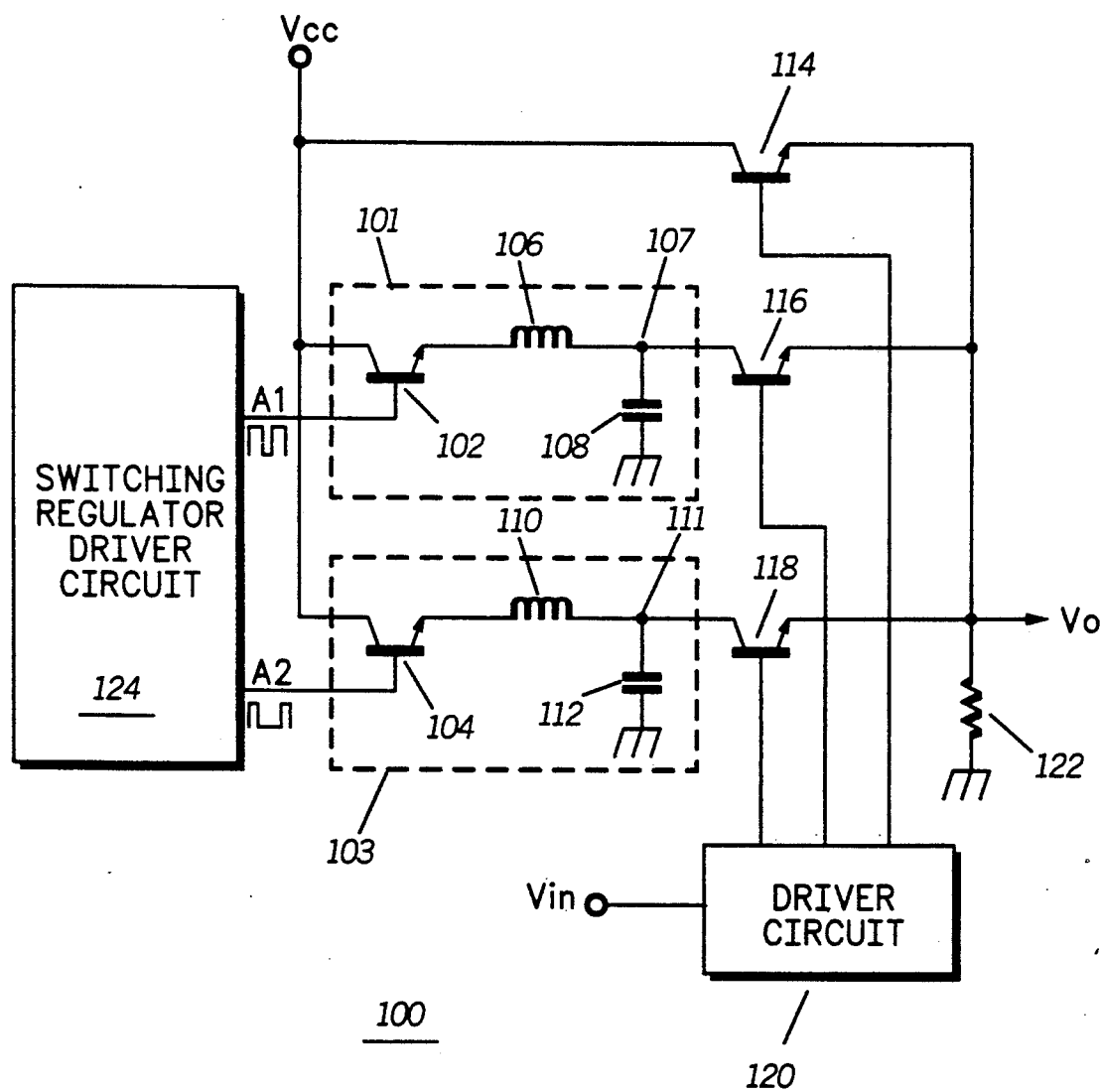
FIG. 2 is an amplitude modulator in accordance with the invention using multiple voltage supplies.

Referring to FIG. 2, the high efficiency modulator circuit 100 for the transceiver 10 is shown. The amplitude modulator circuit 100 uses multiple supply voltages (three in this embodiment) and series pass devices to implement an amplitude modulator having the characteristic of a class A modulator, but with significantly greater efficiency. Each power supply is connected to the modulator's load via a series pass transistor. A driver circuit 120 receives the input signal, Vin, and provides independent drive signals to each series pass device. The driver circuit 120 allows only one series pass transistor to conduct at a time (i.e., the one having having the lowest supply voltage which is sufficient to supply the required output voltage). Thus, power dissipation in the series pass devices is minimized because the voltage drop across these devices is minimized.

The multiple power supplies could be provided by any means, however, switching regulators operating from a single direct current (DC) supply would be most desirable in most cases. In this embodiment, the modulator circuit 100 comprises three branches (for providing three supply voltages). A different number of supply voltages may be desirable for other applications.

The amplitude modulator 100 comprises three pass transistors for amplifying the input information signal to produce the output signal.

The first branch includes an NPN pass transistor 114 having its collector coupled to Vcc, and its emitter coupled to a resistor ($R_L$) 122, representing the load on the circuit 100 (e.g., the RF amplifier 18 shown in FIG. 1). One of the outputs of driver circuit 120 is coupled to the base of the transistor 114 for controlling the flow of current through that transistor, in response to Vin, so that when the transistor 114 is fully on, approximately the entire Vcc voltage is applied to the load resistor 122.

The second branch comprises a switching regulator 101 coupled in series with a pass transistor 116. The switching regulator 101 provides a supply voltage ($F_1$Vcc) which is lower than Vcc at a node 107, where $F_1$ is the transfer function of the switching regulator 101. The switching regulator 101 preferably comprises an NPN transistor 102 and a filter for removing the alternating current (AC) component of the voltage at the emitter of transistor 102. The filter preferably comprises a series inductor 106 and a capacitor 108, having one terminal coupled to ground. The transistor 102 has its collector coupled to Vcc and its base coupled to receive a driving voltage $A_1$ (produced by a switching regulator driver circuit 124) so that the voltage at its emitter is $F_1$Vcc.

The third branch comprises a switching regulator 103 and a pass transistor 118. The switching regulator 103 comprises a transistor 104, and a filter (having a series inductor 110 and a capacitor 112) for providing a substantially DC voltage at the node 111. The base of the transistor 104 is coupled to receive a driving voltage $A_2$, which is also produced by the switching regulator driver circuit 124, to provide a voltage ($F_2$Vcc) at a node 111 that is lower than Vcc and the voltage at the node 107.

The driver circuit 120 provides driving voltages (representing the input voltage, Vin) to the bases of transistors 114, 116, and 118, such that:

1) If $V_o < F_2Vcc + V_t$ (where Vt is the threshold voltage of each pass transistor), only transistor 118 conducts and its current is Vo/RL;
2) If $F_2Vcc < V_o < F_1Vcc + V_t$, only transistor 116 conducts and its current is Vo/RL; and
3) If $F_1Vcc < V_o < F_1Vcc + V_t$, only transistor 114 conducts and its current is $V_o$/RL.

It is noted that a driver circuit 120 allows only one of the transistors 114, 116, 118 to conduct and supply current to the load 122 at any one time. The current to 122 is always supplied from the power supply having the lowest possible voltage. Because the power dissipated (wasted) in the transistors 114, 116, 118 is equal to voltage drop times current, minimizing the supply voltage minimizes the wasted power and increases the efficiency of the amplifier.

When Vin is very small, driver circuit 120 keeps 114 and 116 biased into a non conducting state and the output current is supplied via 118 alone. If Vin increases so that the required output voltage Vn (Vn−KVin) is larger than the voltage at 111, the driver circuit 120 biases transistor 118 into a non-conducting state and allows transistor 116 alone to supply the output current. Similarly, if Vin increases so that the required output voltage Vo (Vo−kVin) is larger than the voltage at 107, the driver circuit 120 biases transistor 116 into a non-conducting state and allows transistor 114 alone to supply the output current. Thus the higher voltage supplies are used only when necessary to provide the required output voltage Vo (Vo−kVin). By this means power dissipation in 114, 116, 118 is minimized and efficiency is increased. A sample of the output voltage is supplied to 120 to make a negative feedback loop to improve the overall linearity of the amplifier.

Thus, the transistors 114, 116, and 118 control the flow of current to the resistor 122, so that current is drawn from the lowest voltage supply which is greater than or equal to a reference voltage. The reference voltage is preferably the sum of the output voltage, Vo and the minimum voltage drop of the pass transistors (i.e., their threshold voltage).

As a concrete example of the operation of the circuit, suppose that the output voltage must vary between zero and 14 volts, and that it has been determined by simulation or other means that the three supply voltages should be 14.4, 11.4, and 7.5 volts for best efficiency. In FIG. 2, the voltages would be 14.4 volts at the collector of transistor 114; 11.4 volts at node 107; and 7.5 volts at node 111. Also suppose that the saturation drop of each transistor is 0.4 volts. There are three distinct modes of operation:

1) When $0 < V_o < 7.2$ v, only transistor 118 conducts and transistors 114 and 116 do not;
2) When $7.2 v < V_o < 11.1$ v only transistor 116 conducts and transistors 114 and 118 do not; and
3) When $11.1 v < V_o < 14.0$, only transistor 114 conducts and transistors 114 and 116 do not.

Figure 3:
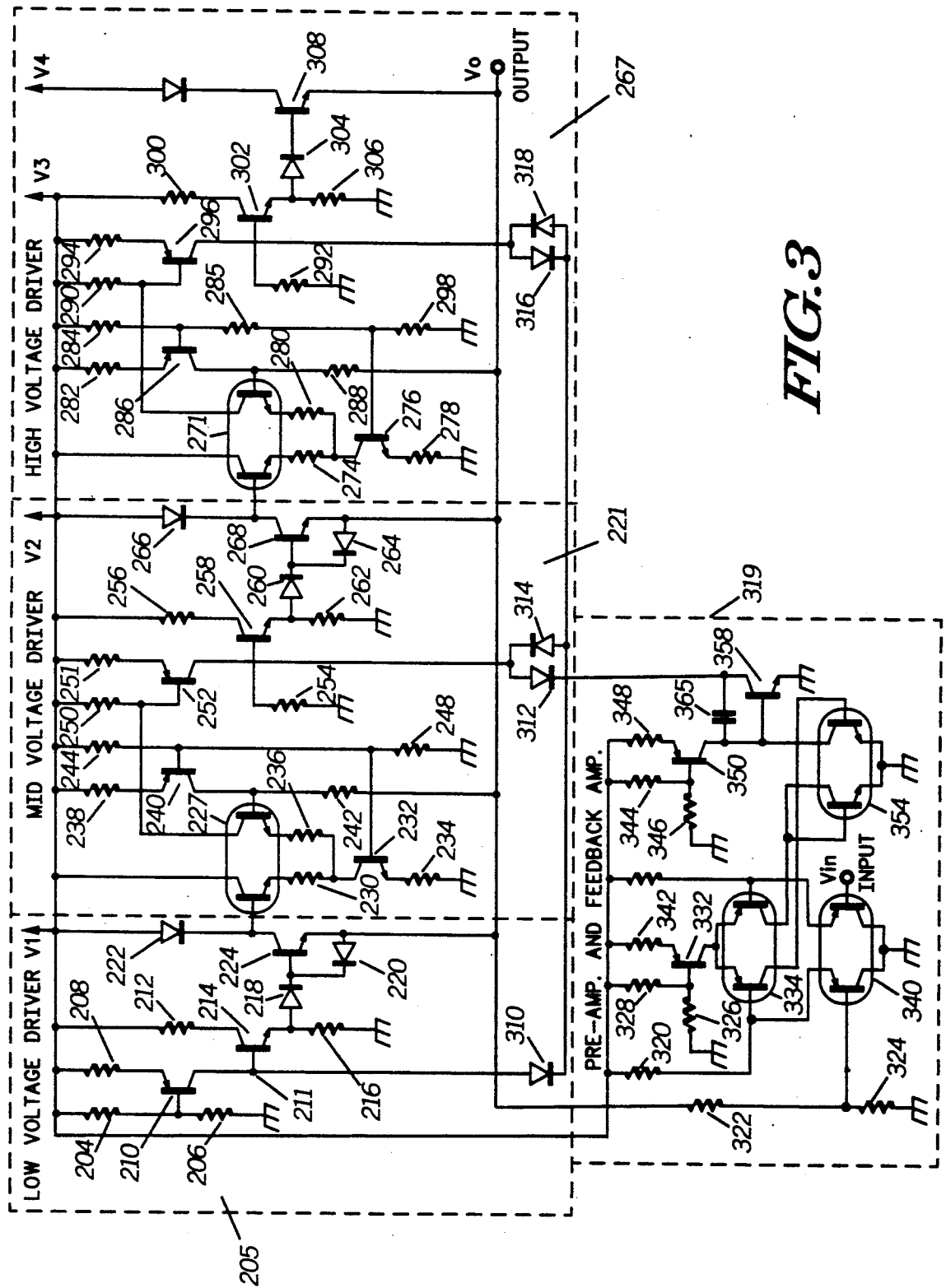
FIG. 3 is a detailed schematic of another circuit in accordance with the invention.

Referring to FIG. 3, a detailed schematic of an amplitude modulator 200, using multiple voltage supplies (V1, V2, and V4) in accordance with the invention, is shown. The amplitude modulator 200 comprises series pass transistors 224, 268, and 308, coupled to power supplies V1, V2, and V4, respectively (power supply V3 is used to drive the driver circuit). The voltage supplies V1, V2, and V4 are used to modulate the carrier signal. The remainder of the circuit 200 constitutes a driver circuit performing the same functions as the one represented by the block diagram 120 of FIG. 2.

A low voltage driver/output circuit 205 operates when the output voltage Vo is less than V1 minus the threshold voltage of the transistor 224. A mid voltage driver output circuit 221 operates when Vo is less than V2 minus the threshold voltage of an NPN transistor 268 and greater than V1. A high voltage driver/output circuit 267 operates when Vo is less than V4 and greater than V2.

A driver circuit, comprising transistors 210 and 214 and resistors 204, 206, 208, 212, and 216, drives the pass transistor 224. Diode 218 couples the emitter of transistor 214 to the base of transistor 224. Diode 220 is disposed between the emitter and base of transistor 224 to prevent the base junction from being destroyed by a reverse voltage.

A differential amplifier 227 measures the voltage drop across transistor 224 and offsets it by the value of that voltage drop, so that when the voltage drop across transistor 224 is less than Vo minus the threshold voltage of transistor 224, transistor 252 switches on, thus enabling the mid voltage driver output circuit 221. Then as transistor 268 turns on, diode 222 becomes reverse biased, thus disabling the circuit 205. Similarly, a differential amplifier 271 measures the voltage drop across the pass transistor 268 and offsets it by the amount of that drop so that when the voltage drop across transistor 268 is less than Vo minus the threshold voltage across the pass transistor 268, transistor 296 switches on, thus enabling the high voltage driver/output circuit 267. Then as transistor 308 turns on, diode 266 becomes reverse biased, thus disabling the circuit 221. Resistors 284 and 285 provide the required bias at the base of the transistor 286. The high voltage driver circuit 267 operates in substantially the same manner as the mid voltage driver circuit 221.

A well-known preamplifier and feedback amplifier 319 receives the signal Vin and combines it (by linear addition) with a sample of the output voltage. The preamplifier and feedback amplifier circuit operates to minimize the overall circuit distortion. Thus, the circuit 300 operates to select the pass transistor having the lowest supply voltage sufficient to produce the level of output signal required by the gain of the pass transistors.

The following part values may be useful in making the circuit shown in FIG. 3:

| | |
|---|---|
| Resistor 251 | 100 Ohms |
| Resistor 212 | 212 Ohms |
| Resistor 294 | 470 Ohms |
| Resistors 230, 236, 274 and 280 | 1.0 kOhms |
| Resistor 324 | 1.0 kOhms (1%) |
| Resistors 216, 262, 306, 330 | 4.7 kOhms |
| Resistor 322 | 9.09 kOhms (1%) |
| Resistors 204, 244, 250, 284, 290, 328, 344 | 10 kOhms |
| Resistors 234, 278 | 16 kOhms |
| Resistors 238, 248, 298 | 22 kOhms |
| Resistor 288 | 27 kOhms |
| Resistors 206, 326, 346 | 150 kOhms |
| Resistors 320, 342 | 162 kOhms |
| Transistors 224, 268, 308 | MJE200 |
| Diodes 218, 220, 260, 264, 304, 310, 312, 314, 316, 318 | 1N914 |
| Transistors 214, 232, 258, 276, 302, 358 | 2N918 |
| Transistors 227, 271, 354 | MD2369 |
| Transistors 210, 240, 252, 286, 296, 332, 350 | 2N4261 |
| Transistors 334, 340 | MD5000A |
| Diodes 222, 266 | 1N5822 or MER340P |
| Capacitor 356 | 470 pF |

As an example, V1 is 7.5 v, V2 is 11.4 v, V3 is 16.5, and V4 is 14.4 v. Assume that the threshold voltage of the pass transistors is 0.4 v. The output voltage will vary between zero and 14 v. The output current will vary between zero and 0.5 amps. The load impedance is 28 Ohms, and consumes between zero and 7 watts. Those skilled in the art will appreciate that the above part numbers may vary in accordance with the particular design criteria.

The operation of FIG. 3 may be better understood by referring to the following description, noting that, the switching power supplies are not shown. The supply voltages are V1, V2, V4. A fourth low current supply, V3, operates the low power circuitry. Block 319 is an operational amplifier with an open collector output state. The input signal Vin is applied to the non-inverting input. A sample of the output voltage, VO, is applied to the inverting input via voltage divider 322, 324. This makes a negative feedback loop around the whole amplifier to improve linearity.

When Vin is small, the output of 319 is supplied via diode 310 to amplifier circuit 214 and 224. Constant current source 210 supplies current to the output stage of the operational amplifier 358 via diode 310. The base current of 214 is the constant current of 210 minus the signal dependent current drawing by 358. Pass transistor 224 supplies current to the output via voltage supply V1 and diode 222.

Differential amplifier 227 measures the voltage difference between the collector and emitter of 224. An intentional offset voltage, approx. the saturation voltage of 224, is introduced by constant current source 240 and resistor 242. Whenever the voltage drop across 224 is greater than the voltage across 242, only the left transistor of 227 conducts. Thus constant current source 252 is prevented from conducting which in turn shuts off base current to 258. Thus 258 is forced to a non-conducting state and does not supply base current to 268, which in turn is forced to a non-conducting state. Base current cannot flow to 258 via diode 314 because there is not enough voltage across 314 to forward bias it. Transistor 258 cannot conduct unless its base voltage is at least as high as the base voltage of transistor 214. The combined voltage drop of approximately 1.2 volts across 310 and 314 prevent this condition from occurring.

In a similar way, differential amplifier 271 prevents 296 from conducting which in turn prevents 302 and in turn 308 from conducting. Thus the output current is drawn only from the lowest voltage supply, V1.

If Vin (and thus Vo) is increased, transistor 224 approaches its saturation voltage (approx. 0.5 volt between collector and emitter). Now the right transistor of the transistor set 227 begins to conduct which in turn causes current source 252 to supply base current to transistor 258 and couples the base of 258 to the output of 319 via (now forward biased) diode 312. Transistor 258 supplies base current to transistor 268 which begins to conduct. Transistor 268 receives its supply current from supply V2 via diode 266.

If Vin is increased even further, Vo increases proportionally, the necessary output current being supplied from V2. Now Vo will be greater than V1. Diodes 218 and 222 are reversed biased and prevent any reverse current from flowing through 224. In this condition all the output current is being supplied from V2 and none from V1 or V4.

If Vin is increased even further, transistor 268 will near its saturation voltage. 267 will operate in a manner exactly analogous to 221. 308 will begin conducting and will supply output current from supply V4. If Vin is then increased a little more, diodes 260 and 266 will be reversed biased and all output current will be supplied form V4.

In summary, the output current is supplied only from the voltage supply which has the lowest voltage which is capable of supplying the required output voltage. That is, the lowest voltage supply where:

(the required Vo + transistor saturation drop + diode voltage drop ≦ supply voltage).

In this way, the power dissipated in the amplifier circuit is minimized and the power efficiency of the amplifier is increased.

What is claimed is:

1. An amplitude modulator circuit, having an input for receiving an input information signal and an output for providing an output signal to a load, the amplitude modulator circuit comprising:

a plurality of amplifying means, each having a selected gain for amplifying the input information signal, and each having an input for selectively receiving a control signal, representing the input signal, for activating the amplifying means and an output coupled to the load to provide the output signal;

coupling means for coupling a different voltage to each amplifying means; and driver means having an input coupled to receive said input signal and having a plurality of driver outputs, each of said driver outputs being coupled to one of the plurality of amplifying means for providing the control signal to the amplifying means having the lowest supply voltage sufficient to provide the selected gain.

2. The amplitude modulator circuit of claim 1, wherein the plurality of amplifying means comprise:

a plurality of pass transistors, each having a first electrode coupled to a supply voltage, a second electrode coupled to the load, and a control electrode coupled to a driver output of the driver means.

3. The amplitude modulator circuit of claim 1, further comprising:

a load, coupled to said amplifying means, for receiving said output voltage.

4. The amplitude modulator circuit of claim 2, wherein the coupling means comprises a plurality of switching regulators, each switching regulator having a first terminal coupled to a direct current power supply, and a second terminal coupled to a pass transistor to provide the supply voltage.

5. The amplitude modulator circuit of claim 4, wherein each switching regulator comprises a switching regulator transistor having a control electrode, a first electrode coupled to a direct current power supply, and a second electrode coupled to a pass transistor for providing a supply voltage thereto.

6. The amplitude modulator circuit of claim 5, further comprising a switching regulator driver circuit having a plurality of outputs, each output being coupled to the control electrode of one of the switching regulator transistors for driving the switching regulator transistor to provide a supply voltage.

7. The amplitude modulator circuit of claim 6, further comprising a filter disposed between the second electrode of each switching regulator transistor and the first electrode of each pass transistor, for removing alternating current components from the supply voltages being provided to the pass transistors.

8. A radio comprising:

an amplitude modulator circuit, having an input for receiving an input information signal and an output for providing an output signal, the amplitude modulator circuit comprising:

a plurality of amplifying means, each having a selected gain for amplifying the input information signal, and each having an input for selectively receiving a control signal, representing the input signal, for activating the amplifying means and an output coupled to the load to provide the output signal;

coupling means for coupling a different voltage to each amplifying means; and driver means having an input coupled to receive said input signal and having a plurality of driver outputs, each of said driver outputs being coupled to one of the plurality of amplifying means for providing the control signal to the amplifying means having the lowest supply voltage sufficient to provide the selected gain.

9. The radio of claim 8, further comprising:

a receiver section having an input for receiving radio-frequency signals and an output for presenting audio frequency signals representing the radio-frequency signals.

10. The radio of claim 8, further comprising:

a load comprising a radio frequency amplifier having a first electrode coupled to receive the output signal of the amplitude modulator, a second electrode coupled to a ground potential, and a control electrode coupled to receive a radio frequency carrier waveform.

11. An amplitude modulator circuit having an input for receiving an input information signal and an output for providing an output signal that is proportional to the input information signal, to a load, the amplitude modulator circuit comprising:

a plurality of pass transistors, each pass transistor having a first electrode coupled to receive a supply voltage, a second electrode for providing the output signal, and a control electrode for selectively receiving a control signal for activating said pass transistor;

means for applying a plurality of supply voltages to the first electrodes of the plurality of pass transistors, at least some of the supply voltages having different values; and driver means having an input coupled to receive the input information signal and having a plurality of driver outputs, each of the driver outputs providing the control signal to the control electrode of the pass transistor having the lowest supply voltage sufficient to supply the required voltage to the load.

* * * * *